United States Patent
Chen

(10) Patent No.: US 9,209,356 B2
(45) Date of Patent: Dec. 8, 2015

(54) LIGHT-EMITTING ELEMENT INCLUDING A LIGHT-EMITTING STACK WITH AN UNEVEN UPPER SURFACE

(75) Inventor: Wei-Yo Chen, Hsinchu (TW)

(73) Assignee: Epistar Corporation, Hsinchu (TW)

(*) Notice: Subject to any disclaimer, the term of this patent is extended or adjusted under 35 U.S.C. 154(b) by 0 days.

(21) Appl. No.: 13/491,970

(22) Filed: Jun. 8, 2012

(65) Prior Publication Data

US 2013/0328077 A1    Dec. 12, 2013

(51) Int. Cl.
*H01L 29/15* (2006.01)
*H01L 33/00* (2010.01)
*H01L 33/22* (2010.01)
*H01L 33/40* (2010.01)
*H01L 33/42* (2010.01)

(52) U.S. Cl.
CPC .............. *H01L 33/22* (2013.01); *H01L 33/405* (2013.01); *H01L 33/42* (2013.01)

(58) Field of Classification Search
USPC .......................................................... 257/98
See application file for complete search history.

(56) References Cited

U.S. PATENT DOCUMENTS

| | | | | |
|---|---|---|---|---|
| 3,986,065 | A * | 10/1976 | Pankove | 313/355 |
| 2003/0081160 | A1* | 5/2003 | Ihida et al. | 349/113 |
| 2005/0035363 | A1* | 2/2005 | Okazaki et al. | 257/98 |
| 2005/0087884 | A1* | 4/2005 | Stokes et al. | 257/778 |
| 2008/0054290 | A1* | 3/2008 | Shieh et al. | 257/99 |
| 2009/0114933 | A1* | 5/2009 | Osawa et al. | 257/96 |
| 2010/0252850 | A1* | 10/2010 | Park et al. | 257/98 |
| 2011/0241050 | A1* | 10/2011 | Ye et al. | 257/98 |
| 2012/0001213 | A1* | 1/2012 | Jorgenson | 257/98 |

* cited by examiner

*Primary Examiner* — Mamadou Diallo
*Assistant Examiner* — Jay C Chang
(74) *Attorney, Agent, or Firm* — Bacon & Thomas, PLLC

(57) ABSTRACT

A light-emitting element includes: a light-emitting stack including an uneven upper surface; a transparent conductive layer formed on the uneven upper surface; an insulating layer formed on the transparent conductive layer and filling the uneven upper surface, and partial regions of the transparent conductive layer are exposed; a reflective layer formed on the transparent conductive layer and the insulating layer; and a contact interface including a current blocking area formed between the insulating layer and the reflective layer and a plurality of first contact regions formed between the transparent conductive layer and the reflective layer; and an electrode structure formed on the reflective layer, and the reflective layer is between the light-emitting stack and the electrode structure in a vertical direction of the light-emitting element; wherein the current blocking area and the plurality of first contact regions are coplanar.

19 Claims, 4 Drawing Sheets

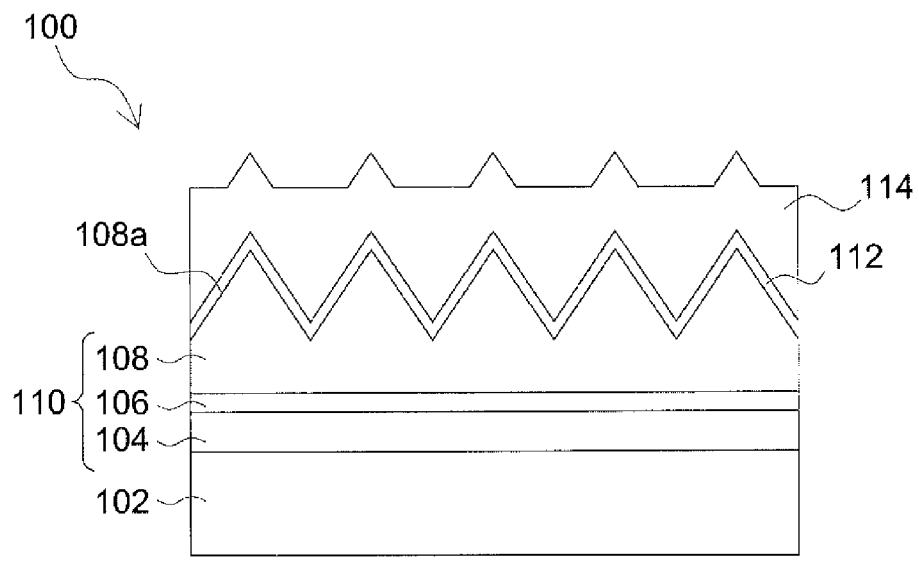
FIG.1A
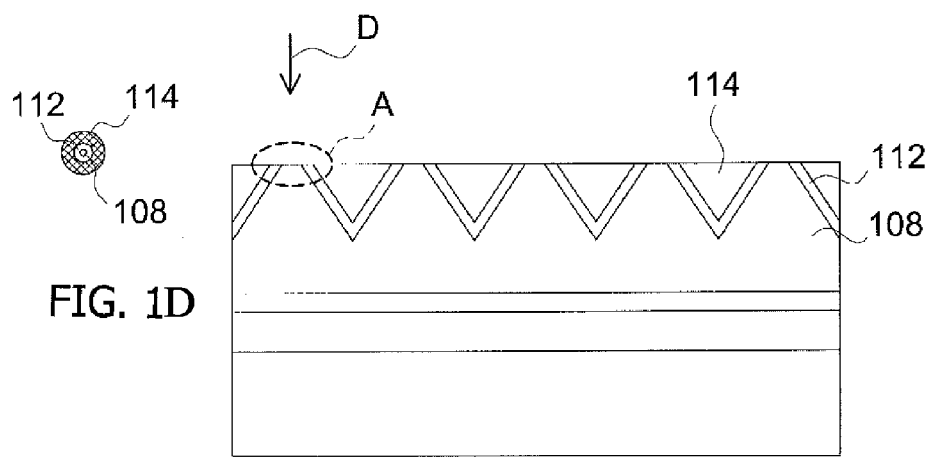
FIG. 1D
FIG.1B

LIGHT-EMITTING ELEMENT INCLUDING A LIGHT-EMITTING STACK WITH AN UNEVEN UPPER SURFACE

TECHNICAL FIELD

The application relates to a light-emitting element including a light-emitting stack with an uneven upper surface, and more particularly, a light-emitting element including a light-emitting stack with an uneven upper surface and a reflective layer.

DESCRIPTION OF BACKGROUND ART

The light radiation theory of light emitting diode (LED) is to generate light from the energy released by the electron moving between an n-type semiconductor and a p-type semiconductor. Because the light radiation theory of LED is different from the incandescent light which heats the filament, the LED is called a "cold" light source. Moreover, the LED is more sustainable, longevous, light and handy, and less power-consumption, therefore it is considered as another option of the light source for the illumination markets. The LED applies to various applications like the traffic signal, backlight module, street light, and medical instruments, and is gradually replacing the traditional lighting sources.

A light-emitting device may include a substrate, a light-emitting stack including an n-type semiconductor layer, an active layer and a p-type semiconductor layer. The light-emitting stack may have roughened structure on the surface thereof to enhance light extraction.

In addition, the light emitting device can be further connected to other components in order to form a light emitting apparatus. The light-emitting device may be mounted onto a submount with the side of the substrate, or a solder bump or a glue material may be formed between the submount and the light-emitting device, therefore a light-emitting apparatus is formed. Besides, the submount further comprises the circuit layout electrically connected to the electrode of the light-emitting device via an electrical conductive structure such as a metal wire.

SUMMARY OF THE DISCLOSURE

A light-emitting element includes: a light-emitting stack including an uneven upper surface; a transparent conductive layer formed on the uneven upper surface; an insulating layer formed on the transparent conductive layer, and partial regions of the transparent conductive layer are exposed; a reflective layer formed on the transparent conductive layer and the insulating layer; and a contact interface including a current blocking area formed between the insulating layer and the reflective layer, and a plurality of first contact regions formed between the transparent conductive layer and the reflective layer.

A light-emitting element includes: a light-emitting stack comprising an uneven upper surface; a first transparent conductive layer formed on and filling the uneven upper surface; a second transparent conductive layer formed on the first transparent conductive layer; a reflective layer formed on the second transparent conductive layer; and a substantially flat reflection interface formed between the reflective layer and the second transparent conductive layer.

A light-emitting element includes: a light-emitting stack including an uneven upper surface; a transparent conductive layer formed on the uneven upper surface; an insulating layer formed on the transparent conductive layer and filling the uneven upper surface, and partial regions of the transparent conductive layer are exposed; a reflective layer formed on the transparent conductive layer and the insulating layer; and a contact interface including a current blocking area formed between the insulating layer and the reflective layer and a plurality of first contact regions formed between the transparent conductive layer and the reflective layer; and an electrode structure formed on the reflective layer, and the reflective layer is between the light-emitting stack and the electrode structure in a vertical direction of the light-emitting element; wherein the current blocking area and the plurality of first contact regions are coplanar; and wherein the reflective layer, the transparent conductive layer and the light-emitting stack are electrically connected.

A light-emitting element includes: a substrate; a light-emitting stack formed on the substrate and including an uneven upper surface;
a transparent conductive layer formed on the uneven upper surface; an insulating layer formed on the transparent conductive layer and filling the uneven upper surface, and partial regions of the transparent conductive layer are exposed; a reflective layer formed on the transparent conductive layer and the insulating layer; and a contact interface including a current blocking area formed between the insulating layer and the reflective layer and a plurality of first contact regions formed between the transparent conductive layer and the reflective layer; and an electrode structure formed on the reflective layer, and the reflective layer is between the light-emitting stack and the electrode structure in a vertical direction of the light-emitting element.

BRIEF DESCRIPTION OF THE DRAWINGS

FIGS. 1A to 1C show a manufacturing method of a light-emitting element in accordance with a first embodiment of the present application.

FIG. 1D show the emphasized area in a top view.

DETAILED DESCRIPTION OF PREFERRED EMBODIMENTS

Figure 1C:
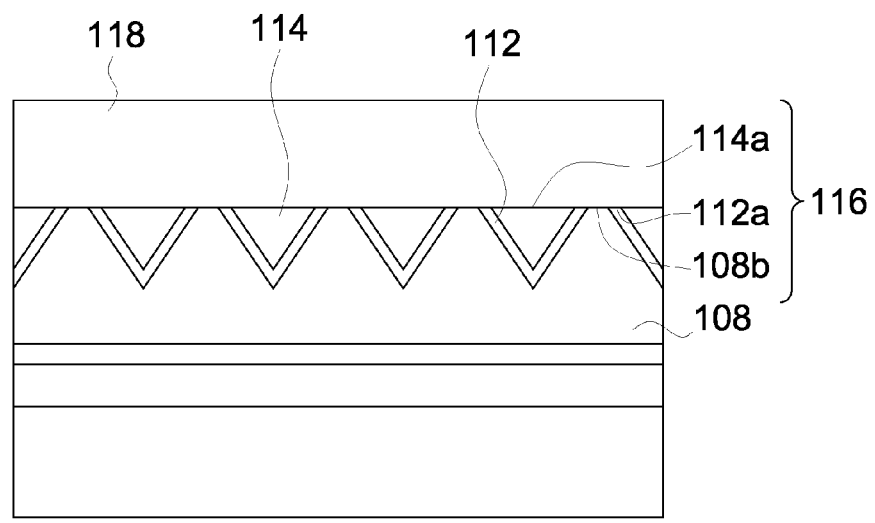

As shown in FIGS. 1A to 1C, a manufacturing method of a light-emitting element in accordance with a first embodiment of the present application is disclosed. Referring to FIG. 1A, a light-emitting element 100 including a substrate 102 and a light-emitting stack 110 formed on the substrate 102 is provided. The light-emitting stack 110 includes a lower semiconductor layer 104, an active layer 106 and an upper semiconductor layer 108. The upper semiconductor layer 108 includes an uneven upper surface 108a, and a transparent conductive layer 112 including ITO, IZO, AZO, or ZnO can be conformably formed on the uneven upper surface 108a. An insulating layer 114 can be formed on the transparent conductive layer 112 and fills the uneven structure resulted from the uneven upper surface 108a. The material of the insulating layer 114 can be $SiO_2$, $TiO_2$, $Al_2O_3$, or SOG.

Referring to FIG. 1B, flatting the upper surface of the insulating layer 114 and exposing a plurality of regions of the transparent conductive layer 112 by etching and/or grinding. The upper semiconductor layer 108 can be optionally exposed during the process of flatting the upper surface of the insulating layer 114.

Referring to FIG. 1C, a reflective layer 118 can be formed on the insulating layer 114 and the transparent conductive layer 112, and a current blocking area 114a can be formed between the insulating layer 114 and the reflective layer 118, and a plurality of first contact regions 112a can be formed between the transparent conductive layer 112 and the reflective layer 118. The current blocking area 114a and the first contact regions 112a form a substantially flat contact interface 116 having a roughness Ra less than 20 nm, therefore enhancing the reflectivity of the reflective layer 118. In addition, if the upper semiconductor layer 108 is exposed during the process of flatting the insulating layer 114, in direction D as shown in FIG. 1B, the emphasized area A of FIG. 1D is a top view of this area. the contact interface 116 can further include a plurality of second contact regions 108b formed between the upper semiconductor layer 108 and the reflective layer 118, and each of the plurality of second contact regions 108b is enclosed by each of the plurality of first contact regions 112a from top view of the light-emitting element 100, and the plurality of first contact regions 112a are enclosed by the current blocking area 114a from top view of the light-emitting element 100. The current activates the light-emitting stack 110 via the reflective layer 118 and the transparent conductive layer 112 before flowing into the light-emitting stack 110, and since the plurality of first contact regions 112a between the reflective layer 118 and the transparent conductive layer 112 are separated, the current can be widely spread before flowing into the light-emitting stack 110.

The plurality of first contact regions 112a has better electrical contact than that of the plurality of second contact regions 108a, is preferred to be ohmic contact. The reflectivity of the reflective layer 118 corresponding to the current blocking area 114a is larger than that corresponding to the plurality of first contact regions 112a and the plurality of second contact regions 108b.

The material of the reflective layer 118 can include one or more than one material selected from a group consisting of Cu, Al, In, Sn, Au, Pt, Zn, Ag, Ti, Pb, Pd, Ge, N, Cr, Cd, Co, Mn, Sb, Bi, Ga, Tl, A, Se, Te, Po, Ir, Re, Rh, Os, W, Li, Na, K, Be, Mg, Ca, Sr, Ba, Zr, Mo, La, Cu—Sn, Cu—Zn, Cu—Cd, Sn—Pb—Sb, Sn—Pb—Z, Ni—Sn, Ni—Co, and Au alloy.

Figure 2:
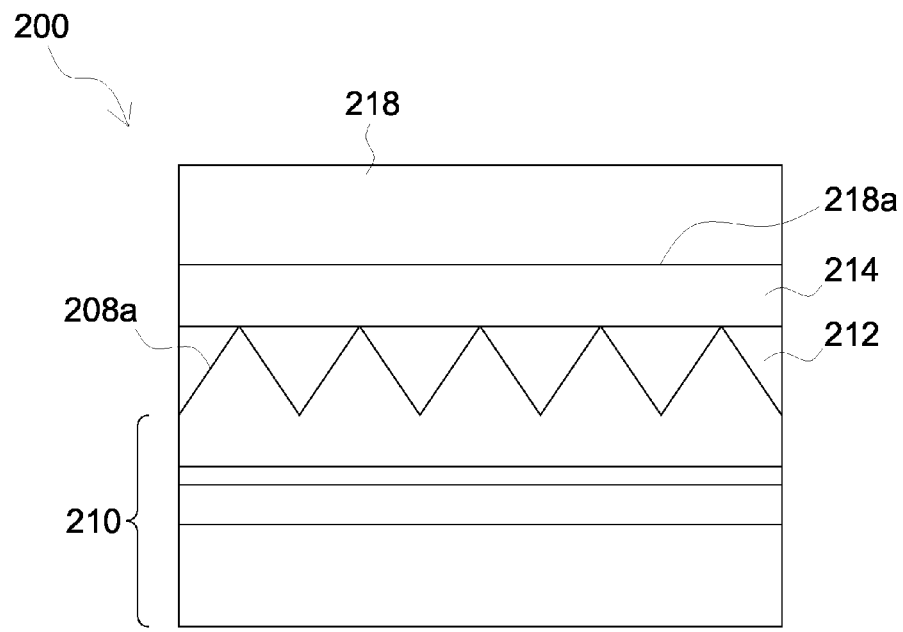
FIG. 2 shows a schematic structure of a light-emitting element in accordance with a second embodiment of the present application.

As shown in FIG. 2, a light-emitting element 200 in accordance with a second embodiment of the present application includes: a light-emitting stack 210 including an uneven upper surface 208a; a first transparent conductive layer 212 formed on the uneven upper surface 208a; a second transparent conductive layer 214 formed on the first transparent conductive layer 212; and a reflective layer 218 formed on the second transparent conductive layer 214. The first transparent conductive layer 212 may be formed by Atomic Layer Deposition (ALD) to fill the uneven upper surface 208a. A substantially flat reflection interface 218a having a roughness Ra less than 20 nm can be formed between the second transparent conductive layer 214 and the reflective layer 218.

The structure of the light-emitting stack 210 is similar to that of the first embodiment, however, the material for filling the uneven upper surface 208a is the first transparent conductive layer 212. The material of the first transparent conductive layer 212 and second transparent conductive layer 214 includes ITO, IZO, AZO, or ZnO. To be more specific, the second transparent conductive layer 214 can be IZO to form the substantially flat reflection interface 218a having high reflectivity between the reflective layer 218, and the first transparent conductive layer 212 can be ITO to have ohmic contact with the light-emitting stack 210.

Figure 3:
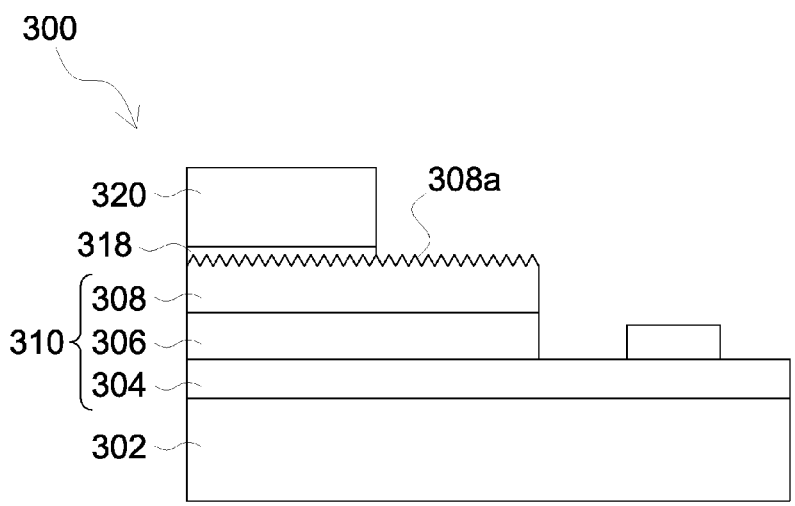
FIG. 3 shows a schematic structure of a light-emitting element in accordance with a third embodiment of the present application.

As shown in FIG. 3, a light-emitting element 300 in accordance with a third embodiment of the present application includes: a substrate 302; a light-emitting stack 310 formed on the substrate 302 and including a lower semiconductor layer 304, an active layer 306 and an upper semiconductor layer 308; an electrode structure 320 formed on the light-emitting stack 310; and a reflective layer 318 formed between the electrode structure 320 and the light-emitting stack 310. Similar to the first embodiment or the second embodiment, the light-emitting stack 310 can have an uneven upper surface 308a. A transparent conductive layer (not shown) and an insulating layer (not shown) can be formed between the uneven upper surface 308a and the reflective layer 318 as disclosed in the first embodiment, or two transparent conductive layers (not shown) can be formed between the uneven upper surface 308a and the reflective layer 318 as disclosed in the second embodiment. The light-emitting element 300 emits most light from the front side thereof, and the reflective layer 318 can be formed only under the electrode structure 320 to enhance light extraction.

Figure 4:
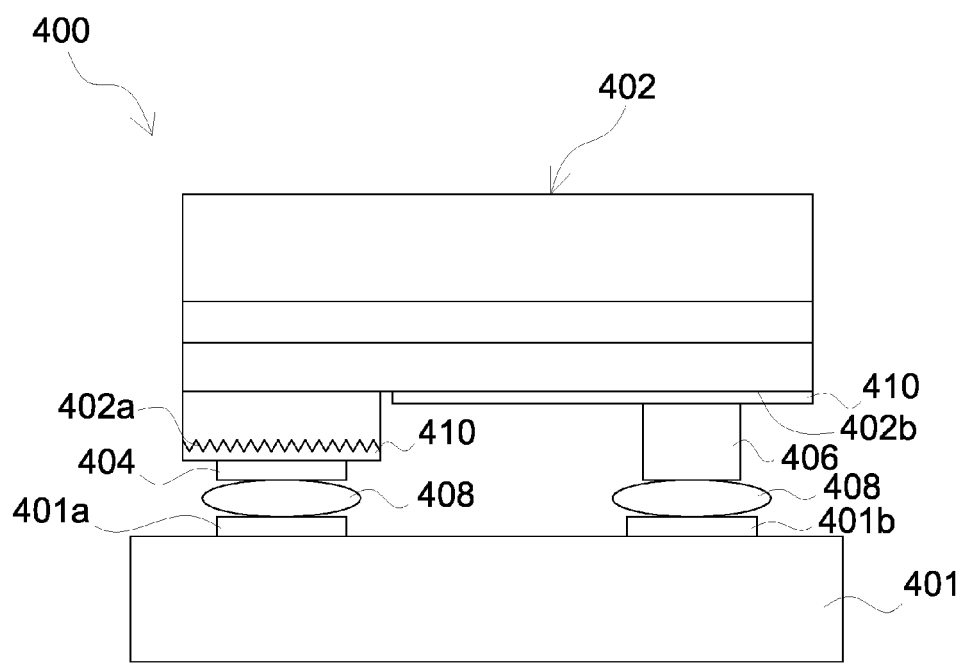
FIG. 4 shows a schematic structure of a light-emitting element in accordance with a forth embodiment of the present application.

As shown in FIG. 4, a light-emitting device 400 in accordance with a forth embodiment of the present application includes: a submount 401 including a first contact 401a and a second contact 401b, and a light-emitting element 402 formed above the submount 401. The light-emitting element 402 can include: an uneven surface 402a; a mesa surface 402b; a first electrode 404 formed on the uneven surface 402a; a second electrode 406 formed on the mesa surface 402b, wherein the first electrode 404 and the second electrode 406 have different polarities; and a reflective layer 410 formed between the uneven surface 402a and the first electrode 404 and formed between the mesa surface 402b and the second electrode 406. A bonding structure 408 can be formed between the first contact 401a and the first electrode 404 and formed between the second contact 401b and the second electrode 406. A transparent conductive layer (not shown) and an insulating layer (not shown) can be formed between the uneven upper surface 402a and the reflective layer 410 as disclosed in the first embodiment, or two transparent conductive layers (not shown) can be formed between the uneven upper surface 402a and the reflective layer 410 as disclosed in the second embodiment. In addition, the reflective layer 410 can cover the uneven surface 402a and the mesa surface 402b entirely for reflecting most light from the light-emitting element 402.

Each of the light-emitting stacks of the aforesaid embodiments can be formed in an MOCVD chamber and composed of materials such as the series of aluminum gallium indium phosphide (AlGaInP), the series of aluminum gallium indium nitride (AlGaInN), and/or the series of zinc oxide (ZnO). The active layer can be configured to be a single heterostructure (SH), a double heterostructure (DH), a double-side double heterostructure (DDH), or a multi-quantum well (MQW) structure.

Although the present application has been explained above, it is not the limitation of the range, the sequence in practice, the material in practice, or the method in practice. Any modification or decoration for present application is not detached from the spirit and the range of such.

What is claimed is:
1. A light-emitting element comprising:
a light-emitting stack comprising an uneven upper surface;

a transparent conductive layer formed on the uneven upper surface;

an insulating layer formed on the transparent conductive layer and filling the uneven upper surface, and partial regions of the transparent conductive layer are exposed;

a reflective layer formed on the transparent conductive layer and the insulating layer; and a contact interface comprising a current blocking area formed between the insulating layer and the reflective layer and a plurality of first contact regions formed between the transparent conductive layer and the reflective layer; and an electrode structure formed on the reflective layer, and the reflective layer is between the light-emitting stack and the electrode structure in a vertical direction of the light-emitting element;

wherein the current blocking areas and the plurality of first contact regions are coplanar; and wherein the reflective layer, the transparent conductive layer and the light-emitting stack are electrically connected.

2. The light-emitting element according to claim 1, wherein the contact interface is substantially flat.

3. The light-emitting element according to claim 2, wherein the roughness Ra of the contact interface is less than 20 nm.

4. The light-emitting element according to claim 2, wherein the reflectivity of the current blocking area is larger than that of the plurality of first contact regions.

5. The light-emitting element according to claim 1, wherein the transparent conductive layer is conformably formed on the uneven upper surface.

6. The light-emitting element according to claim 1, wherein the light-emitting stack comprises an upper semiconductor layer having the uneven upper surface, and the contact interface further comprises a plurality of second contact regions between the upper semiconductor layer and the reflective layer.

7. The light-emitting element according to claim 6, wherein the second contact regions are enclosed by the first contact regions from top view.

8. The light-emitting element according to claim 6, wherein the plurality of first contact regions has better electrical contact than that of the plurality of second contact regions.

9. The light-emitting element according to claim 6, wherein the reflectivity of the current blocking area is larger than that of the plurality of first contact regions and the plurality of second contact regions.

10. The light-emitting element according to claim 1, wherein each of the first contact regions are enclosed by the current blocking area from top view.

11. The light-emitting element according to claim 1, further comprising a submount formed on the electrode structure and a bonding structure formed between the submount and the electrode structure.

12. The light-emitting element according to claim 1, wherein the material of the transparent conductive layer comprises ITO, IZO, AZO, or ZnO.

13. The light-emitting element according to claim 1, wherein the uneven upper surface comprises a cavity, the transparent conductive layer is formed in the cavity, and the insulating layer is formed continuously on the transparent conductive layer in the cavity, without exposing the transparent conductive layer.

14. The light-emitting element according to claim 1, wherein the uneven upper surface comprises a flat upper surface, the insulating layer is devoid on the flat upper surface.

15. A light-emitting element comprising:
a substrate;
a light-emitting stack formed on the substrate and comprising an uneven upper surface;
a transparent conductive layer formed on the uneven upper surface;
an insulating layer formed on the transparent conductive layer and filling the uneven upper surface, and partial regions of the transparent conductive layer are exposed;
a reflective layer formed on the transparent conductive layer and the insulating layer; and
a contact interface comprising a current blocking area formed between the insulating layer and the reflective layer and a plurality of first contact regions formed between the transparent conductive layer and the reflective layer;
wherein the current blocking area and the plurality of first contact regions are coplanar; and
an electrode structure formed on the reflective layer, and the reflective layer is between the light-emitting stack and the electrode structure in a vertical direction of the light-emitting element.

16. The light-emitting element according to claim 15, wherein the transparent conductive layer comprises ohmic contact with the light- emitting stack.

17. The light-emitting element according to claim 15, wherein the transparent conductive layer and the substrate are on two opposite sides of the light-emitting stack, respectively.

18. The light-emitting element according to claim 15, further comprising a submount formed on the electrode structure and bonding structure formed between the submount and the electrode structure.

19. The light-emitting element according to claim 1, further comprising a substrate on a bottom surface of the light-emitting stack, wherein the bottom surface is opposite to the uneven upper surface.

* * * * *